United States Patent
Richards et al.

(10) Patent No.: US 6,178,320 B1
(45) Date of Patent: Jan. 23, 2001

(54) RADIO RECEIVER WITH A DOUBLE-BALANCED MIXER CIRCUIT HAVING SIGNAL DAMPING ELEMENTS

(75) Inventors: Anthony H. Richards, Cambridge (GB); Andreas Wichern, Hamburg (DE)

(73) Assignee: U.S. Philips Corporation, New York, NY (US)

( * ) Notice: Under 35 U.S.C. 154(b), the term of this patent shall be extended for 0 days.

(21) Appl. No.: 09/045,353

(22) Filed: Mar. 20, 1998

(30) Foreign Application Priority Data

Mar. 20, 1997 (GB) .................................................. 9705749

(51) Int. Cl.[7] ...................................................... H04B 1/26
(52) U.S. Cl. ........................... 455/326; 455/333; 327/355
(58) Field of Search ..................................... 455/326, 333, 455/323; 327/355; 485/318, 319, 320

(56) References Cited

U.S. PATENT DOCUMENTS

| | | | | |
|---|---|---|---|---|
| 4,344,188 | * | 8/1982 | Tanabe et al. | 455/333 |
| 4,461,042 | * | 7/1984 | Tanabe et al. | 455/333 |
| 4,636,663 | * | 1/1987 | Jongepier et al. | 327/355 |
| 5,329,189 | * | 7/1994 | Ushida et al. | 327/355 |
| 5,448,772 | * | 9/1995 | Grandfield | 455/333 |
| 5,521,545 | | 5/1996 | Terry et al. | 327/359 |
| 5,559,457 | * | 9/1996 | Uda et al. | 327/355 |
| 5,570,056 | * | 10/1996 | Groe | 455/326 |
| 5,630,228 | * | 5/1997 | Mittel | 455/326 |
| 5,689,207 | * | 11/1997 | Nakatsuka et al. | 327/355 |
| 5,760,632 | * | 6/1998 | Kawakami et al. | 327/355 |
| 5,809,410 | * | 9/1998 | Stuebing et al. | 455/333 |
| 5,826,182 | * | 10/1998 | Gilbert | 455/326 |
| 5,854,973 | * | 12/1998 | Holtvoeth | 455/245.1 |
| 5,875,392 | * | 2/1999 | Tanaka | 455/333 |
| 5,999,804 | * | 12/1999 | Forgues | 455/333 |
| 6,006,081 | * | 12/1999 | Moore | 455/326 |
| 6,026,286 | * | 2/2000 | Long | 455/333 |

* cited by examiner

*Primary Examiner*—Edward F. Urban
*Assistant Examiner*—Rafael Perez-Gutierrez
(74) *Attorney, Agent, or Firm*—Jack D. Slobod

(57) ABSTRACT

A radio receiver having a double-balanced mixer stage comprising two pairs of emitter coupled transistors (T1 to T4), the common emitters of each pair of transistors being connected to identical current sources (T5, T6 and T9). A local oscillator signal is applied differentially to junctions (58, 60) of the base electrodes of the first and fourth transistors (T1, T4) and the second and third transistors (T2, T3), respectively. The rf input signal is applied to the common emitter junctions (50, 52) via damping resistors (R3, R4) which also are connected to respective current sources. Outputs from the pairs of emitter coupled transistors are coupled to cascode stages (66, 68). Further damping resistors (R1, R2) are connected between the differential local oscillator input (22A, 22B) and the junctions (58, 60) of the base electrodes. The damping resistors are of a low value typically 25 ohms and serve to stabilize the double-balanced mixer circuit and prevent it from going into oscillation.

20 Claims, 1 Drawing Sheet

RADIO RECEIVER WITH A DOUBLE-BALANCED MIXER CIRCUIT HAVING SIGNAL DAMPING ELEMENTS

BACKGROUND OF THE INVENTION

1. Field of the Invention

The present invention relates to a radio receiver having particular, but not exclusive, application in a digital, wide area pager.

2. Description of the Related Art

In view of the relatively small size of digital pagers there has been a desire to reduce the number of batteries carried by a pager and the objective is to have single cell operation. Accordingly the circuitry used in the pager is required to operate at about 1 volt and if a higher voltage is required then a voltage multiplier is provided. A critical part of a receiver is the frequency down-conversion stage which is normally implemented as a double-balanced mixer circuit. Double-balanced mixer circuits operating on 2 cell supplies are known per se. U.S. Pat. No 5,521,545 discloses a development of a double-balanced mixer circuit which enables it to operate at a lower voltage. An examination of the circuit disclosed in U.S. Pat. No 5,521,545 has shown that over the range of frequencies, between 150 MHz and 950 MHz, which are used by paging operators, there are frequency bands when this known double-balanced mixer circuit becomes unstable and behaves as an oscillator.

OBJECT AND SUMMARY OF THE INVENTION

An object of the invention is to eliminate this instability in low voltage double-balanced mixer circuits.

Accordingly to a first aspect of the present invention there is provided a radio receiver comprising means for receiving an input signal, local oscillator signal generating means and a frequency down conversion stage having a first input for connection to the means for receiving an input signal, a second input for receiving a local oscillator signal and an output for a frequency down-converted signal, the frequency down conversion stage comprising first, second, third and fourth transistors of the same conductivity type, emitter electrodes of the first and second transistors and of the third and fourth transistors, respectively, being coupled together to define first and second emitter junctions, collector electrodes of the first and third transistors and of the second and fourth transistors being connected to respective first and second output junctions, base electrodes of the first and fourth transistors and of the second and third transistors being coupled to respective first and second local oscillator junctions, first and second local oscillator inputs coupled to the first and second local oscillator junctions, respectively, first and second means for providing substantially identical currents to the first and second emitter junctions, first and second signal input terminals coupled to current paths between said first and second current providing means and the first and second emitter junctions, respectively, and signal damping elements coupled respectively between the first and second local oscillator inputs and the first and second local oscillator junctions and between the first and second signal input terminals and the first and second emitter junctions.

According to a second aspect of the present invention there is provided a double balanced mixer circuit comprising first, second, third and fourth transistors of the same conductivity type, emitter electrodes of the first and second transistors and of the third and fourth transistors, respectively, being coupled together to define first and second emitter junctions, collector electrodes of the first and third transistors and of the second and fourth transistors being connected to respective first and second output junctions, base electrodes of the first and fourth transistors and of the second and third transistors being coupled to respective first and second local oscillator junctions, first and second local oscillator inputs coupled to the first and second local oscillator junctions, respectively, first and second means for providing substantially identical currents to the first and second emitter junctions, first and second signal input terminals coupled to current paths between said first and second current providing means and the first and second emitter junctions, respectively, and signal damping elements coupled respectively between the first and second local oscillator inputs and the first and second local oscillator junctions and between the first and second signal input terminals and the first and second emitter junctions.

The present invention is based on the recognition of the fact that by providing small amounts of damping at selected points in the local oscillator and rf feeds to the switch stages of the double-balanced mixer circuit, frequency instability is eliminated over the band of frequencies of interest. The damping means may be purely resistive and be implemented as equal value resistors in the respective signal feed paths. The value of resistance is low and a typical value is of the order of 25 ohms.

BRIEF DESCRIPTION OF THE DRAWINGS

The present invention will now be described by way of example with reference to the accompanying drawings, wherein.

In the drawings the same reference numerals have been used to indicate corresponding features.

DETAILED DESCRIPTION OF THE PREFERRED EMBODIMENTS

Figure 1:
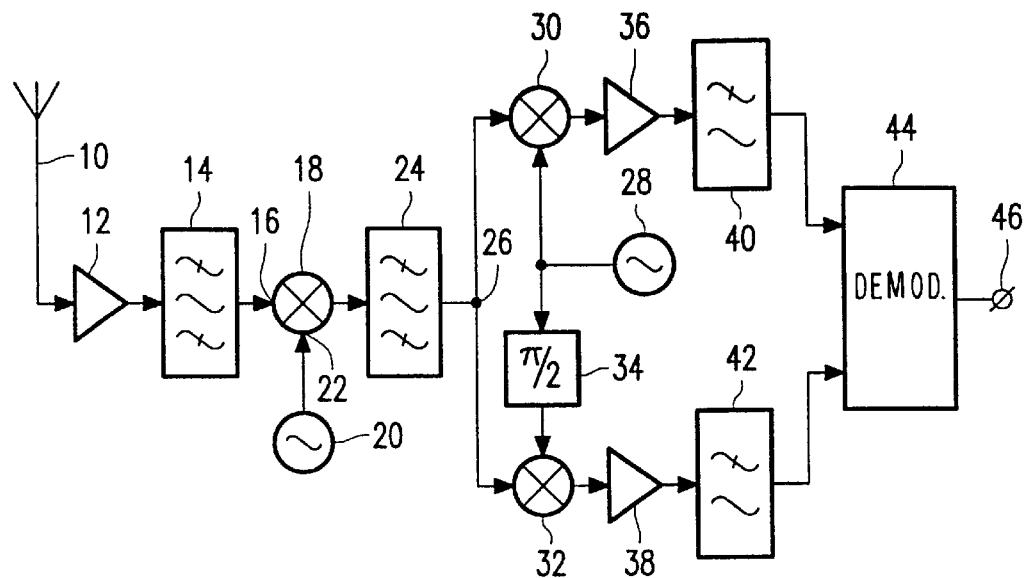
FIG. 1 is a block schematic diagram of a radio receiver.

Referring to FIG. 1, the receiver comprises an antenna 10 which is coupled by way of an rf amplifier 12 to a band pass filter 14 which selects the band of frequencies of interest. An output of a filter is coupled to a first input 16 of a mixer 18. A local oscillator signal from a local oscillator 20 is applied to a second input 22 of the mixer 18. The output from the mixer 18 is an IF signal which is filtered in a band pass or high pass filter 24 to provide a broad band signal which is applied to a junction 26 whereat the signal is split into two paths and applied to first inputs of mixers 30 and 32. An output of a local oscillator 28 is applied to a second input of the mixer 32 by way of a 90° phase shifter 34 and to a second input of the mixer 30. The local oscillator frequency applied to the mixer 30, 32 is such as to mix a wanted signal in the broad band IF signal from the band pass filter 24 down to a zero IF. The outputs of the mixers 30, 32 are quadrature related signals. Post mixer amplifiers 36, 38 are connected to the outputs of the mixers 30, 32, respectively. The outputs from the amplifiers is coupled to low pass filters 40, 42 which pass the wanted products of mixing to a demodulator 44 known per se, for providing an output signal on a terminal 46.

Figure 2:
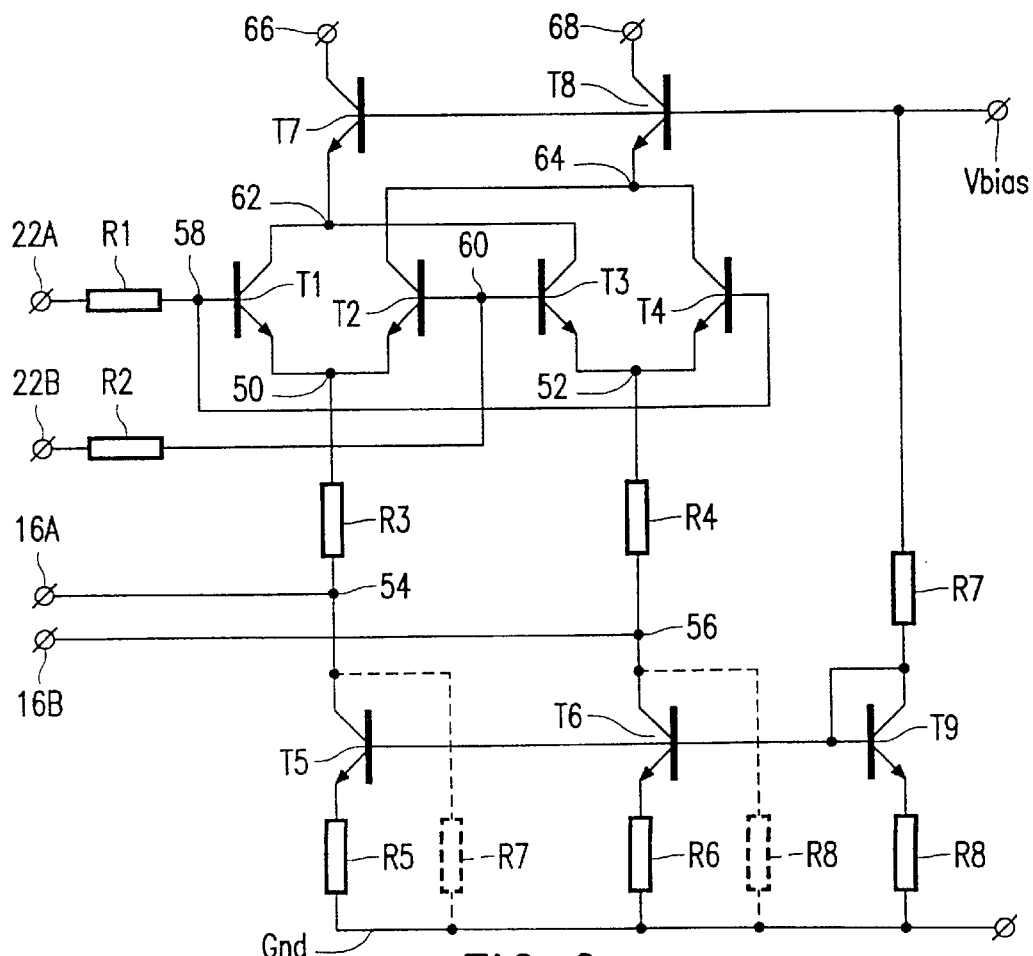
FIG. 2 is a schematic circuit diagram of one embodiment of a double-balanced mixer circuit.

Referring to FIG. 2 the double-balance mixer circuit comprises NPN junctions T1, T2 and T3, T4 connected as emitter coupled pair circuits with the emitter electrodes of transistors T1, T2 and T3, T4 coupled together to junctions 50, 52, respectively. The base electrodes of the transistors T1, T4 are connected together and their common junction 58 is connected by way of a resistor R1 to one of the local oscillator input terminals 22A. The base electrodes of the transistors T2, T3 are connected together and their common junction 60 is coupled by way of a resistor R2 to a second local oscillator input terminal 22B. The collector electrodes of the transistors T1, T3 and T2, T4 are connected together and their common junctions 62, 64, respectively, are connected to the emitter electrodes of common base NPN transistors T7, T8. Balanced output signals appear across terminals 66, 68 connected respectively to the collector electrodes of the transistors T7, T8. A bias voltage supply Vbias is supplied to the base electrodes of the transistors T7, T8.

The emitter junctions 50, 52 are connected to respective current sources constituted by a current mirror circuit formed by NPN transistors T5, T6 and T9. The collector-emitter path of transistor T9 is coupled between Vbias and Gnd lines by means of resistors R7, R8. The collector and base electrodes of the transistor T9 are coupled together. The collector electrodes of the transistors T5, T6 are coupled by way of resistors R3, R4, respectively, to the junctions 50, 52, and the emitter electrodes of the transistors T5, T6 are coupled by way of the resistors R5, R6, respectively, to the Gnd line. A junction 54 of the resistor R3 and the collector electrode of the transistor T5 is connected to one rf input terminal 16A and a junction 56 of the resistor R4 and the collector electrode of the resistor T6 is connected to a second rf input terminal 16B. The base electrodes of the transistors T5, T6 are connected to the base electrode of the transistor T9.

In operation the rf input signal is applied in phase opposition to the terminals 16A, 16B and the local oscillator signal is applied in phase opposition to the inputs 22A, 22B. The current mirror current source comprising identical transistors T5, T6 ensures that the same constant current is applied to the junctions 50, 52, respectively. By injecting the rf signal at the junctions 54, 56 the double-balanced mixer circuit operates at a relatively low voltage which is suitable for the lower power requirements of pagers. The transistors T7, T8 are cascode transistors whose purpose is to improve the reverse isolation of the mixer circuit and to ensure its output impedance at the IF frequencies is held constant and is independent of variations on the local oscillator and rf ports and bias voltage supplies. The resistors R1, R2, R3 and R4 are of a low value, typically 25 ohms, and their purpose is to stabilize the circuit to a wide range of frequencies and prevent oscillation.

Although not shown in the drawings, the mixers 30, 32 can also be double balanced mixer circuits of the type shown in FIG. 2. In such an arrangement the i.f. signal is applied in phase opposition to the terminals 16A, 16B and the local oscillator 28 output is coupled directly, or by way of the phase shifter 34, to the terminals 22A, 22B, respectively.

The current sources comprising the current mirror transistors T5, T6 may be replaced by low value resistors R7, R8, shown in broken lines.

From reading the present disclosure, other modifications will be apparent to persons skilled in the art. Such modifications may involve other features which are already known in the design, manufacture and use of radio receivers, double-balanced mixers and component parts thereof and which may be used instead of or in addition to features already described herein.

What is claimed is:

1. A radio receiver comprising means for receiving an input signal, local oscillator signal generating means and a frequency down conversion stage having a first input for connection to the means for receiving an input signal, a second input for receiving a local oscillator signal and an output for a frequency down-converted signal, the frequency down conversion stage including a mixer circuit comprising first, second, third and fourth transistors of the same conductivity type, emitter electrodes of the first and second transistors and of the third and fourth transistors, respectively, being coupled together to define first and second emitter junctions, collector electrodes of the first and third transistors and of the second and fourth transistors being connected to respective first and second output junctions, base electrodes of the first and fourth transistors and of the second and third transistors being coupled to respective first and second local oscillator junctions, first and second local oscillator inputs coupled to the first and second local oscillator junctions, respectively, first and second means for providing substantially identical currents to the first and second emitter junctions, first and second signal input terminals coupled to current paths between said first and second current providing means and the first and second emitter junctions, respectively, and signal damping elements coupled respectively between the first and second local oscillator inputs and the first and second local oscillator junctions and between the first and second signal input terminals and the first and second emitter junctions.

2. A receiver as claimed in claim 1, wherein the signal damping elements comprise resistive devices.

3. A receiver as claimed in claim 2, wherein said means for providing substantially identical currents to the first and second emitter junctions comprise fifth and sixth transistors having collector electrodes connected to the first and second input terminals, respectively.

4. A receiver as claimed in claim 3, wherein cascode connected transistors are coupled to the respective first and second output junctions.

5. A receiver as claimed in claim 2, wherein cascode connected transistors are coupled to the respective first and second output junctions.

6. A receiver as claimed in claim 1, wherein the signal damping elements comprise resistive devices of substantially the same resistance value.

7. A receiver as claimed in claim 6, wherein said means for providing substantially identical currents to the first and second emitter junctions comprise fifth and sixth transistors having collector electrodes connected to the first and second input terminals, respectively.

8. A receiver as claimed in claim 7, wherein cascode connected transistors are coupled to the respective first and second output junctions.

9. A receiver as claimed in claim 6, wherein cascode connected transistors are coupled to the respective first and second output junctions.

10. A receiver as claimed in claim 1, wherein said means for providing substantially identical currents to the first and second emitter junctions comprise fifth and sixth transistors having collector electrodes connected to the first and second input terminals, respectively.

11. A receiver as claimed in claim 10, wherein cascode connected transistors are coupled to the respective first and second output junctions.

12. A receiver as claimed in claim 1, wherein cascode connected transistors are coupled to the respective first and second output junctions.

13. A mixer circuit comprising first, second, third and fourth transistors of the same conductivity type, emitter electrodes of the first and second transistors and of the third and fourth transistors, respectively, being coupled together to define first and second emitter junctions, collector electrodes of the first and third transistors and of the second and fourth transistors being connected to respective first and second output junctions, base electrodes of the first and fourth transistors and of the second and third transistors being coupled to respective first and second local oscillator junctions, first and second local oscillator inputs coupled to the first and second local oscillator junctions, respectively, first and second means for providing substantially identical currents to the first and second emitter junctions, first and second signal input terminals coupled to current paths between said first and second current providing means and the first and second emitter junctions, respectively, and signal damping elements coupled respectively between the first and second local oscillator inputs and the first and second local oscillator junctions and between the first and second signal input terminals and the first and second emitter junctions.

14. A mixer circuit as claimed in claim 13, wherein the signal damping elements comprise resistive devices.

15. A mixer circuit as claimed in claim 14, wherein said means for providing substantially identical currents to the first and second emitter junctions comprise fifth and sixth transistors having collector electrodes connected to the first and second input terminals, respectively.

16. A mixer circuit as claimed in claim 14, wherein cascode connected transistors are coupled to the respective first and second output junctions.

17. A mixer circuit as claimed in claim 13, wherein the signal damping elements comprise resistive devices of substantially the same resistance value.

18. A mixer circuit as claimed in claim 17, wherein said means for providing substantially identical currents to the first and second emitter junctions comprise fifth and sixth transistors having collector electrodes connected to the first and second input terminals, respectively.

19. A mixer circuit as claimed in claim 13, wherein said means for providing substantially identical currents to the first and second emitter junctions comprise fifth and sixth transistors having collector electrodes connected to the first and second input terminals, respectively.

20. A mixer circuit as claimed in claim 13, wherein cascode connected transistors are coupled to the respective first and second output junctions.

* * * * *